(12) United States Patent
Park

(10) Patent No.: US 7,569,477 B2
(45) Date of Patent: Aug. 4, 2009

(54) METHOD FOR FABRICATING FINE PATTERN IN SEMICONDUCTOR DEVICE

(75) Inventor: Jung-Woo Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 28 days.

(21) Appl. No.: 11/824,362

(22) Filed: Jun. 29, 2007

(65) Prior Publication Data

US 2008/0081479 A1 Apr. 3, 2008

(30) Foreign Application Priority Data

Sep. 28, 2006 (KR) ................ 10-2006-0095059

(51) Int. Cl.
*H01L 21/4763* (2006.01)
(52) U.S. Cl. ............... 438/622; 438/635; 438/637; 438/717; 438/725; 438/761; 257/E21.257; 257/E21.579; 257/E23.167
(58) Field of Classification Search ............ 438/942, 438/717, 736, 671, 950, 253, 255, 258, 445, 438/622, 623, 624, 635, 636, 637, 638, 640, 438/672, 691, 692, 700, 725, 758, 761; 257/E21.257, 257/579, E23.167
See application file for complete search history.

(56) References Cited

U.S. PATENT DOCUMENTS

| 5,635,423 A * | 6/1997 | Huang et al. ............ 438/638 |
| 6,833,319 B2 * | 12/2004 | Lee et al. ............... 438/637 |
| 7,309,653 B2 * | 12/2007 | Anderson et al. ......... 438/691 |
| 7,314,810 B2 * | 1/2008 | Jung ..................... 438/445 |
| 7,479,366 B2 * | 1/2009 | Hagiwara ................ 430/312 |
| 2004/0266100 A1 * | 12/2004 | Cho et al. .............. 438/253 |
| 2005/0090055 A1 * | 4/2005 | Lee et al. ............... 438/256 |
| 2006/0094250 A1 * | 5/2006 | Lee et al. ............... 438/758 |
| 2007/0148983 A1 * | 6/2007 | Lee et al. ............... 438/717 |

FOREIGN PATENT DOCUMENTS

| KR | 1999-0061090 | 7/1999 |
| KR | 2001-0107233 | 12/2001 |

* cited by examiner

*Primary Examiner*—Michael S Lebentritt
(74) *Attorney, Agent, or Firm*—Blakely, Sokoloff, Taylor & Zafman

(57) ABSTRACT

A method for fabricating a fine pattern in a semiconductor device includes forming a first photoresist pattern over an etch target layer, forming a first hard mask layer over a substrate structure, planarizing the first hard mask layer to form a first hard mask pattern and expose the first photoresist pattern, removing the first photoresist pattern, forming a second photoresist pattern enclosing the first hard mask pattern, forming a second hard mask layer over the substrate structure, planarizing the second hard mask layer to form a second hard mask pattern and expose the first hard mask pattern, removing the second photoresist pattern, and etching the etch target layer using the first hard mask pattern and the second hard mask pattern.

6 Claims, 7 Drawing Sheets

METHOD FOR FABRICATING FINE PATTERN IN SEMICONDUCTOR DEVICE

CROSS-REFERENCE TO RELATED APPLICATIONS

The present invention claims priority of Korean patent application number 10-2006-0095059, filed on Sep. 28, 2006, which is incorporated by reference in its entirety.

BACKGROUND OF THE INVENTION

The present invention relates to a method for fabricating a semiconductor device, and more particularly, to a method for fabricating a fine pattern in a semiconductor device.

The technology for embodying a fine pattern in a semiconductor device is a technology necessary for achieving a large scale of integration in a next generation device. A typical method for forming a fine pattern includes repeatedly performing a mask patterning, a hard mask etch, a mask patterning, and a hard mask etch using a multiple-layer hard mask structure. Such method may provide limitations such as complicated processes and changes in the size of patterns depending on etch conditions. Also, there are limitations in usage of hard mask materials, and a unit cost of the pattern is expensive. Thus, a large burden is imposed on the fabrication cost.

SUMMARY OF THE INVENTION

Embodiments of the present invention are directed to provide a method for fabricating a fine pattern in a semiconductor device, which can perform a patterning process with a mask, without using a multiple-layer hard mask structure, such that a change in the size of patterns is substantially reduced and critical processes are simplified.

In accordance with an aspect of the present invention, there is provided a method for fabricating a fine pattern in a semiconductor device, including: forming a first photoresist pattern over an etch target layer; forming a first hard mask layer over a substrate structure; planarizing the first hard mask layer to form a first hard mask pattern and expose the first photoresist pattern; removing the first photoresist pattern; forming a second photoresist pattern enclosing the first hard mask pattern; forming a second hard mask layer over the substrate structure; planarizing the second hard mask layer to form a second hard mask pattern and expose the first hard mask pattern; removing the second photoresist pattern; and etching the etch target layer using the first hard mask pattern and the second hard mask pattern.

DESCRIPTION OF SPECIFIC EMBODIMENTS

Embodiments of the present invention relate to a method for fabricating a fine pattern in a semiconductor device.

FIGS. 1A to 1M illustrate cross-sectional views of a method for fabricating a fine pattern in a semiconductor device in accordance with an embodiment of the present invention.

Figure 1A:
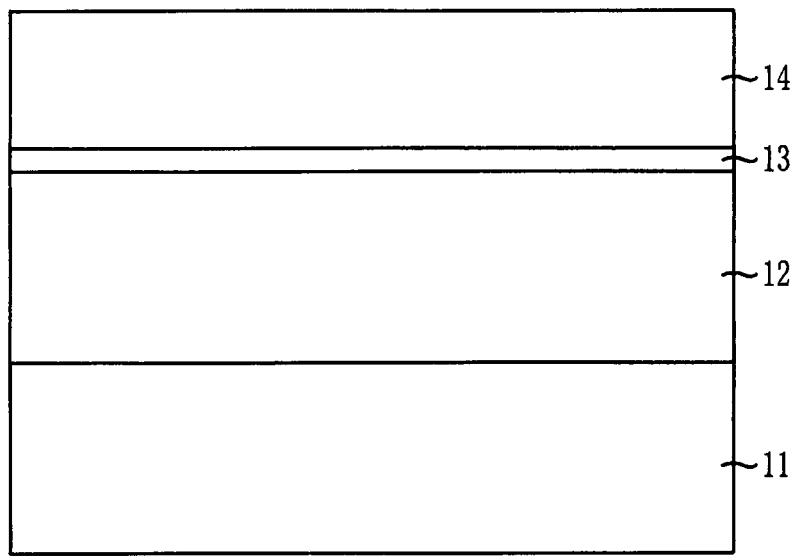
FIGS. 1A to 1M illustrate cross-sectional views of a method for fabricating a fine pattern in a semiconductor device in accordance with an embodiment of the present invention.

Referring to FIG. 1A, an etch target layer 12, e.g., a conductive layer or an insulation layer, is formed over a substrate 11. A first bottom anti-reflective coating (BARC) layer 13 is formed over the etch target layer 12. A first photoresist layer 14 is formed over the first BARC layer 13.

Figure 1B:
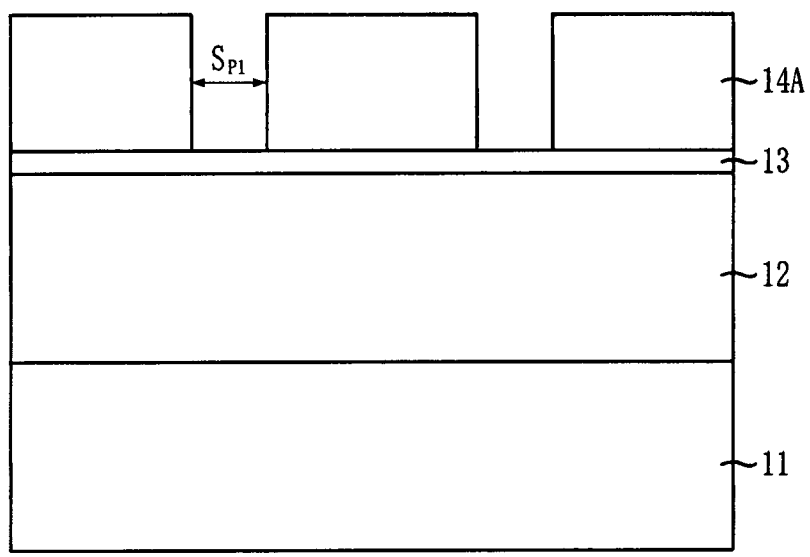

Referring to FIG. 1B, a photo mask process is performed using a photo-exposure and developing process to form a first photoresist pattern 14A. A spacing distance between adjacent portions of the first photoresist pattern 14A is referred to as a first spacing distance $S_{P1}$.

Figure 1C:
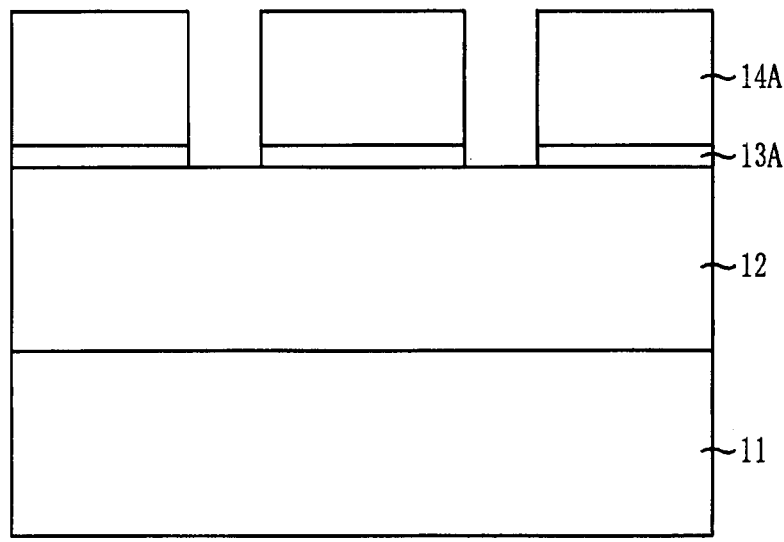

Referring to FIG. 1C, the first BARC layer 13 is etched using the first photoresist pattern 14A as an etch barrier. Reference numeral 13A refers to an etched first BARC layer 13A.

Figure 1D:
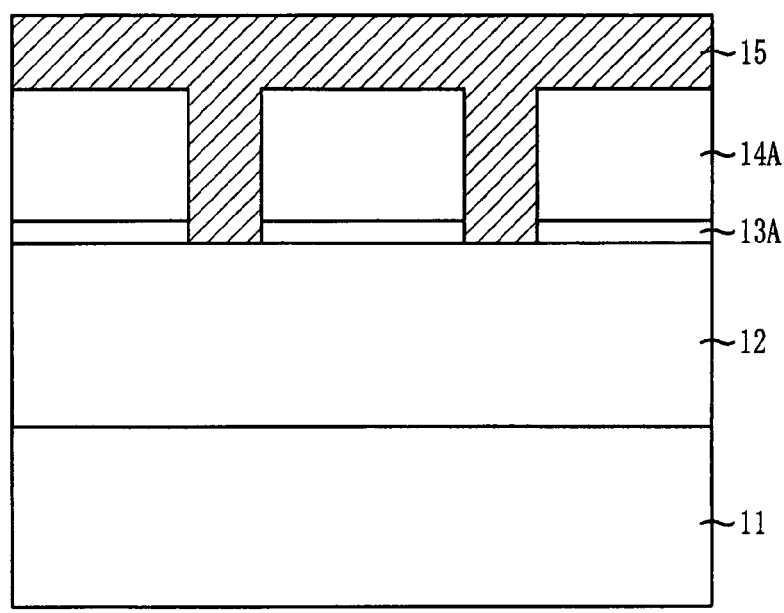

Referring to FIG. 1D, a first hard mask layer 15 is formed over the first photoresist pattern 14A and the etch target layer 12. The first hard mask layer 15 includes a nitride-based layer, a silicon oxide layer, a tungsten layer, a polysilicon layer, or an amorphous carbon layer. The first hard mask layer 15 may be formed by performing a physical vapor deposition (PVD) method, a chemical vapor deposition (CVD) method, or a coating method.

Figure 1E:
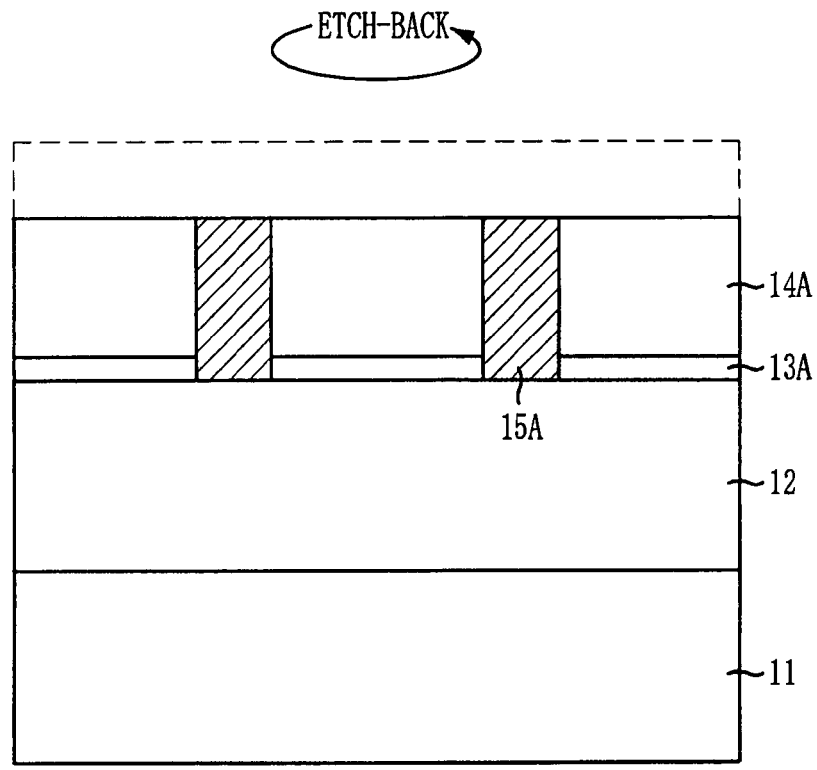

Referring to FIG. 1E, an etch-back process is performed to planarize the first hard mask layer 15 until the first photoresist pattern 14A is exposed. Thus, a first hard mask pattern 15A is formed. A portion of the first photoresist pattern 14A may also be planarized while performing the etch-back process on the first hard mask layer 15.

Figure 1F:
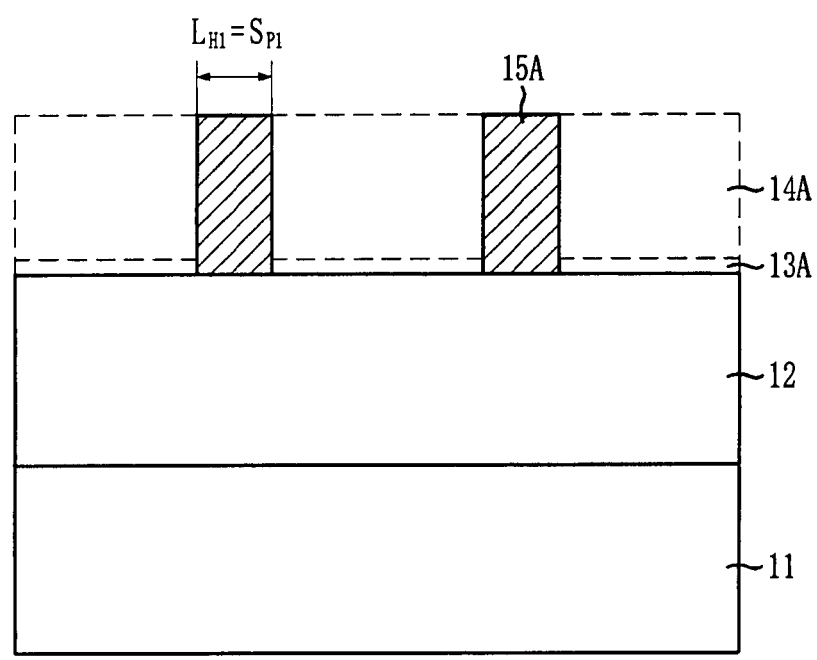

Referring to FIG. 1F, a photoresist removal process is performed to remove the first photoresist pattern 14A and the etched first BARC layer 13A formed below the first photoresist pattern 14A. Consequently, the first hard mask pattern 15A remains over certain portions of the etch target layer 12 corresponding to the first spacing distance $S_{P1}$ of the first photoresist pattern 14A. Thus, a first line width $L_{H1}$ of the first hard mask pattern 15A is substantially the same as the first spacing distance $S_{P1}$ of the first photoresist pattern 14A, i.e., $S_{P1}=L_{H1}$.

Figure 1G:
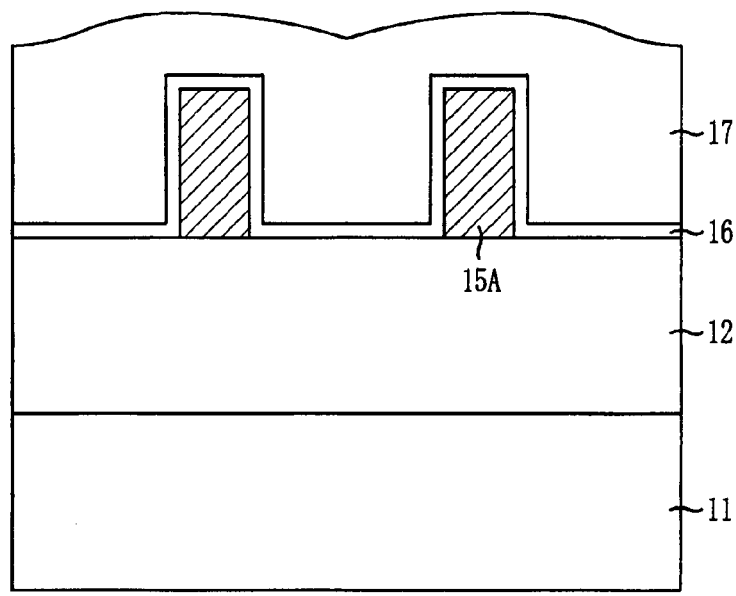

Referring to FIG. 1G, a second BARC layer 16 is formed over the surface profile of the first hard mask pattern 15A and the etch stop layer 12. A second photoresist layer 17 is formed over the resultant structure, covering the first hard mask pattern 15A.

Figure 1H:
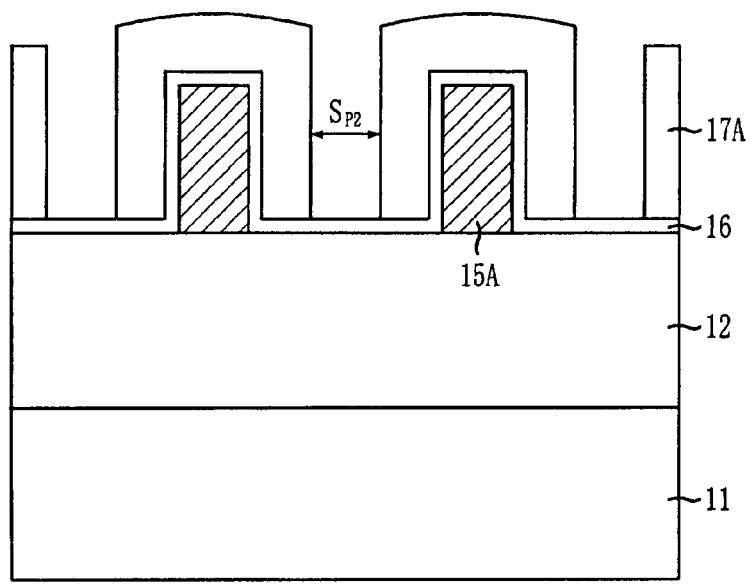

Referring to FIG. 1H, a photo mask process is performed using a photo-exposure and developing process to form a second photoresist pattern 17A. A spacing distance between adjacent portions of the second photoresist pattern 17A is referred to as a second spacing distance $S_{P2}$. The second photoresist pattern 17A is formed in a structure that encloses the first hard mask pattern 15A.

The photo mask process for patterning the second photoresist layer 17 is performed in a manner that spacing distances and line widths of the first hard mask pattern 15A and a subsequent second hard mask pattern are substantially the same.

Figure 1I:
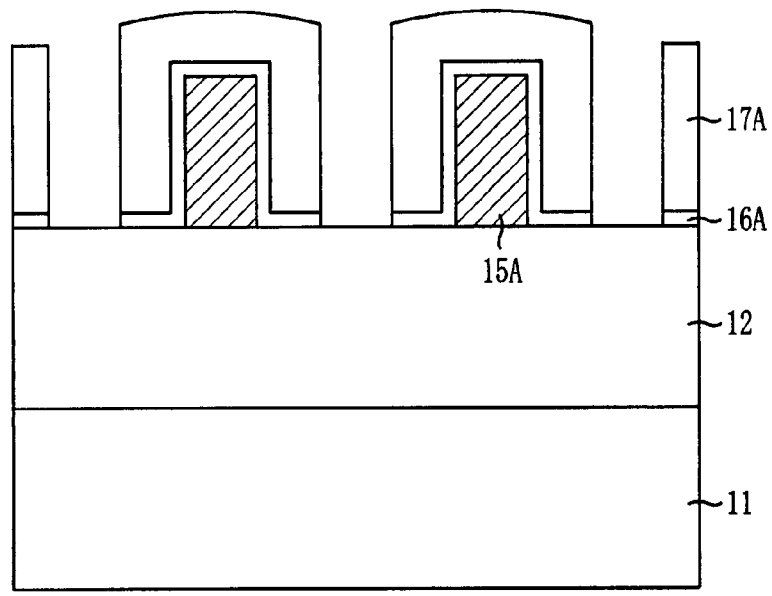

Referring to FIG. 1I, the second BARC layer 16 is etched using the second photoresist pattern 17A as an etch barrier to expose certain portions of the etch target layer 12. Reference numeral 16A refers to an etched second BARC layer 16A.

Figure 1J:
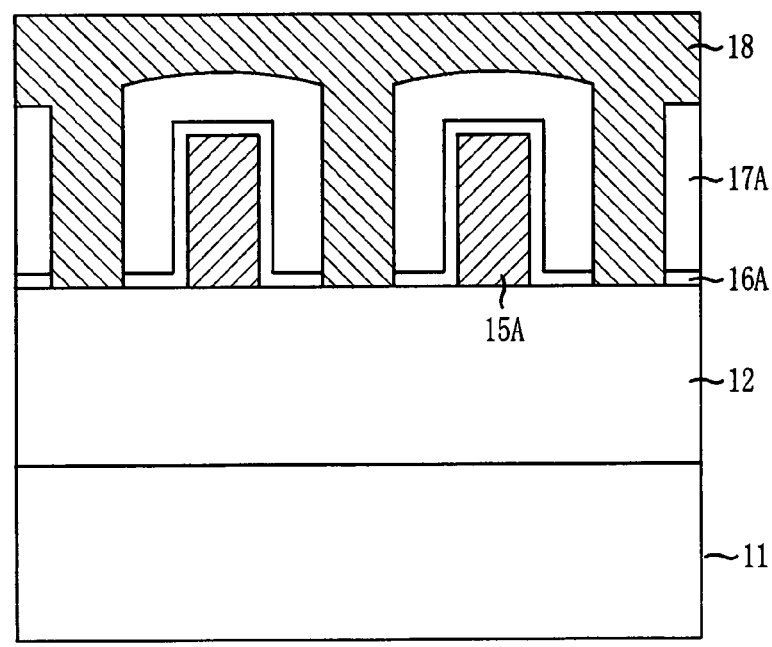

Referring to FIG. 1J, a second hard mask layer 18 is formed over the second photoresist pattern 17A and the etch target layer 12. The second hard mask layer 18 includes a nitride-based layer, a silicon oxide layer, a tungsten layer, a polysilicon layer, or an amorphous carbon layer. The second hard mask layer 18 may be formed using a PVD method, a CVD method, or a coating method.

Figure 1K:
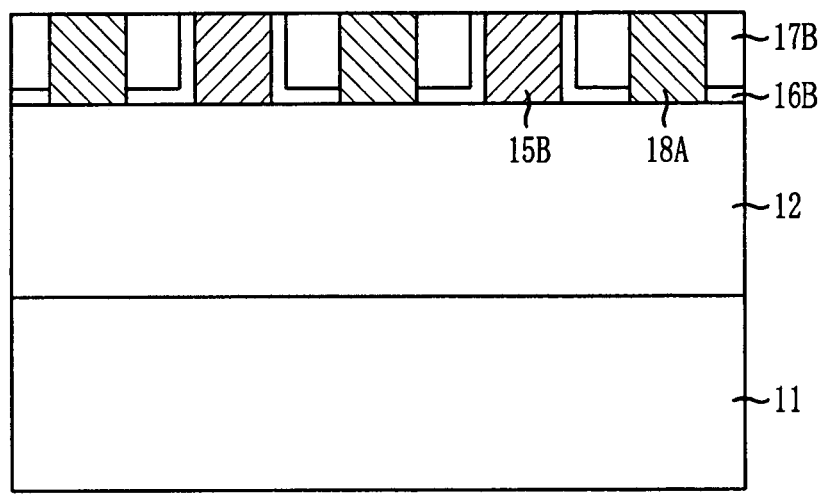

Referring to FIG. 1K, an etch-back process is performed to planarize the second hard mask layer 18 such that an upper portion of the first hard mask pattern 15A is exposed. Thus, a second hard mask pattern 18A is formed. Reference numeral 15B refers to a remaining first hard mask pattern 15B. A portion of the second photoresist pattern 17A may be planarized while performing the etch-back process on the second hard mask layer 18. Reference numerals 17B and 16B refer to a remaining second photoresist pattern 17B and a remaining second BARC layer 16B, respectively.

Figure 1L:
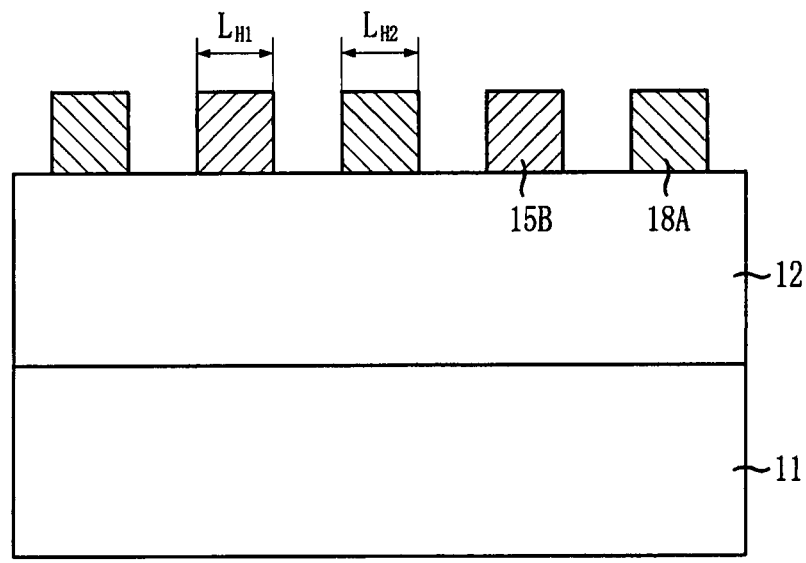

Referring to FIG. 1L, a photoresist removal process is performed to remove the remaining second photoresist pattern 17B and the remaining second BARC layer 16B. Thus, the second hard mask pattern 18A corresponding to the second spacing distance $S_{P2}$ of the second photoresist pattern 17A is formed. Thus, a second line width $L_{H2}$ of the second hard mask pattern 18A is substantially the same as the second spacing distance $S_{P2}$ of the second photoresist pattern 17A, i.e., $S_{P2}=L_{H2}$.

Figure 1M:
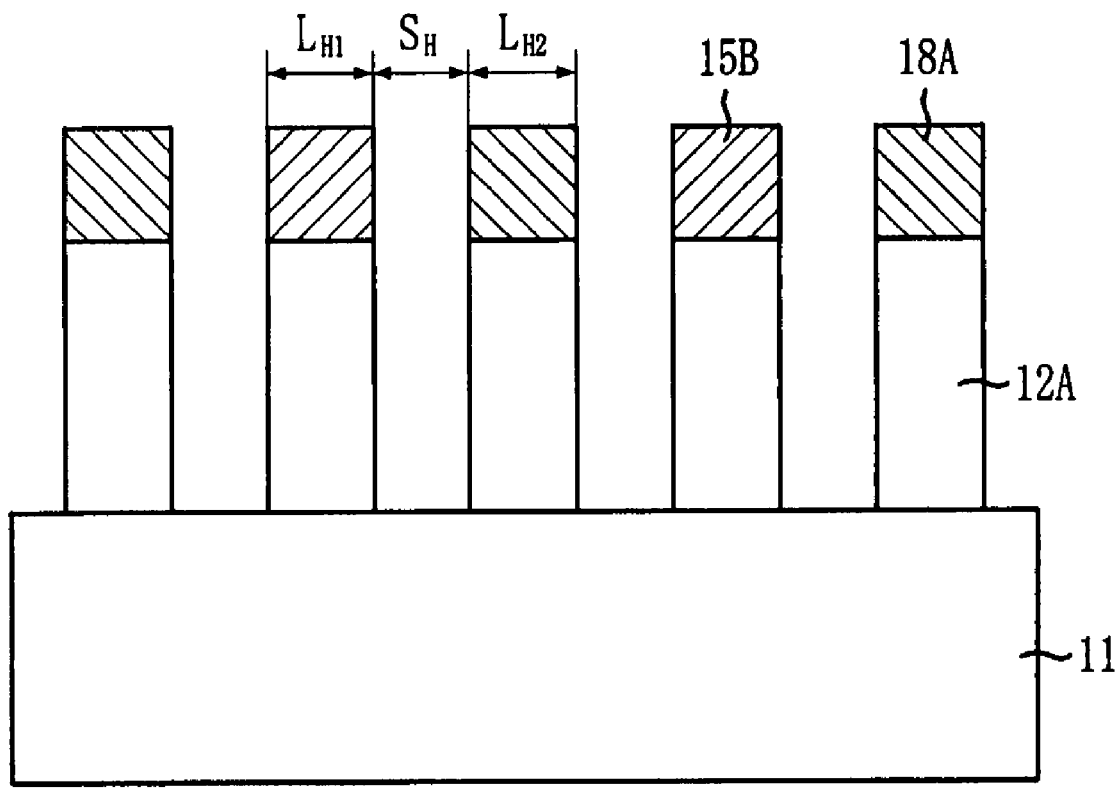

Referring to FIG. 1M, the etch target layer 12 is etched to form an etch target pattern 12A using the remaining first hard mask pattern 15B and the second hard mask pattern 18A as an etch barrier. The first and second line widths $L_{H1}$ and $L_{H2}$ of the remaining first hard mask pattern 15B and the second hard mask pattern 18A and a spacing distance $S_H$ between the remaining first hard mask pattern 15B and the second hard mask pattern 18A adjacent to each other are substantially the same. Thus, a line width of the etch target pattern 12A, which is substantially the same as the first and second line widths $L_{H1}$ and $L_{H2}$, and the spacing distance $S_H$ between portions of the etch target pattern 12A are substantially the same.

In accordance with the embodiment of the present invention, two times of the photoresist patterning and the hard mask etch process are performed instead of using a multiple-layer hard mask structure as a hard mask for etching the etch target layer. Thus, the size change of the etch target pattern depending on the hard mask may be minimized. Also, process cost may be reduced because the mask process is performed without using an expensive hard mask material. The embodiments of the present invention may be applied in most fields related to patterning in formation processes for semiconductor devices such as a dynamic random access memory (DRAM) or a flash.

In accordance with the embodiment of the present invention, a change in the pattern size depending on the hard mask pattern may be minimized through repeatedly performing the mask patterning, the hard mask layer formation, and the etch process, instead of using a multiple-layer hard mask structure. Also, the critical processes may be simplified, the fabrication cost may be decreased because expensive hard mask materials are generally not used.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a fine pattern in a semiconductor device, the method comprising:
    forming an etch target layer over a substrate;
    forming a plurality of first photoresist patterns over a portion of the etch target layer;
    forming a first hard mask layer over a resultant structure including the first photoresist patterns, filling a cap between neighboring first photoresist patterns;
    planarizing the first hard mask layer to form first hard mask patterns and expose the first photoresist patterns;
    removing the first photoresist patterns;
    forming second photoresist patterns enclosing the first hard mask patterns;
    forming a second hard mask layer over a resultant structure including the second photoresist patterns, filling a gap between neighboring second photoresist patterns;
    planarizing the second hard mask layer to form second hard mask patterns and expose the first hard mask patterns;
    removing the second photoresist patterns; and
    etching the etch target layer using the first hard mask patterns and the second hard mask patterns.

2. The method of claim 1, wherein planarizing the first hard mask layer and planarizing the second hard mask layer comprise performing an etch-back process.

3. The method of claim 1, wherein the first hard mask patterns and the second hard mask patterns are formed to substantially the same line width.

4. The method of claim 1, wherein a spacing distance between the first hard mask patterns and the second hard mask patterns is substantially the same as line widths of the first hard mask pattern and the second hard mask pattern.

5. The method of claim 1, wherein the first hard mask layer and the second hard mask layer each comprise at least one of a nitride-based layer, a silicon oxide layer, a tungsten layer, a polysilicon layer, and an amorphous carbon layer.

6. The method of claim 1, wherein first hard mask layer and the second hard mask layer are formed using one of a physical vapor deposition method, a chemical vapor deposition method, and a coating method.

* * * * *